United States Patent [19]
Yanagisawa et al.

[11] Patent Number: 6,147,915
[45] Date of Patent: Nov. 14, 2000

[54] SEMICONDUCTOR INTEGRATED CIRCUIT

[75] Inventors: Makoto Yanagisawa; Kazuyuki Kanazashi; Yuji Kurita, all of Kawasaki, Japan

[73] Assignee: Fujitsu Limited, Kawasaki, Japan

[21] Appl. No.: 09/296,547

[22] Filed: Apr. 22, 1999

[30] Foreign Application Priority Data

Apr. 24, 1998 [JP] Japan .................................. 10-115508
Jul. 17, 1998 [JP] Japan .................................. 10-203495

[51] Int. Cl.[7] .............................. G11C 7/00; G11C 8/00
[52] U.S. Cl. .......................................... 365/194; 365/233
[58] Field of Search ...................... 365/230.03, 230.06, 365/233, 194

[56] References Cited

U.S. PATENT DOCUMENTS

| | | | |
|---|---|---|---|
| 5,539,696 | 7/1996 | Patel | 365/233 |
| 5,666,322 | 9/1997 | Conkle | 365/194 |
| 5,886,948 | 3/1999 | Ryan | 365/233 |
| 5,903,514 | 5/1999 | Sawada | 365/233 |
| 5,940,330 | 8/1999 | Kim | 365/233 |
| 5,946,244 | 8/1999 | Manning | 365/194 |
| 5,973,988 | 10/1999 | Nakahira et al. | 365/233 |
| 5,973,991 | 10/1999 | Tsuchida et al. | 365/233 |

*Primary Examiner*—Trong Phan
*Attorney, Agent, or Firm*—Arent Fox Kintner Plotkin & Kahn PLLC

[57] ABSTRACT

A semiconductor integrated circuit includes a plurality of circuits operating in parallel in accordance with a timing signal and having an enabled state and a disabled state, a control circuit setting each of the plurality of circuits to the enable state or the disabled state in accordance with an operation mode, and a timing adjustment circuit which adjusts the timing signal in accordance with a number of circuits which are in the enabled state.

13 Claims, 19 Drawing Sheets

FIG. 10
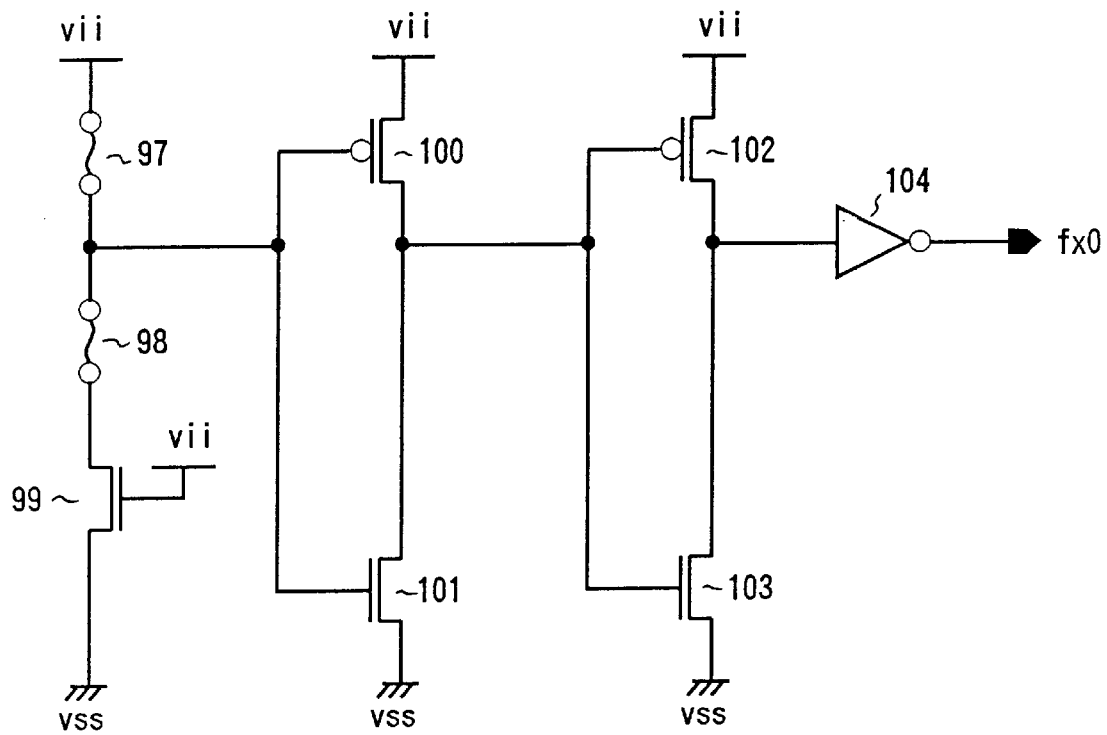
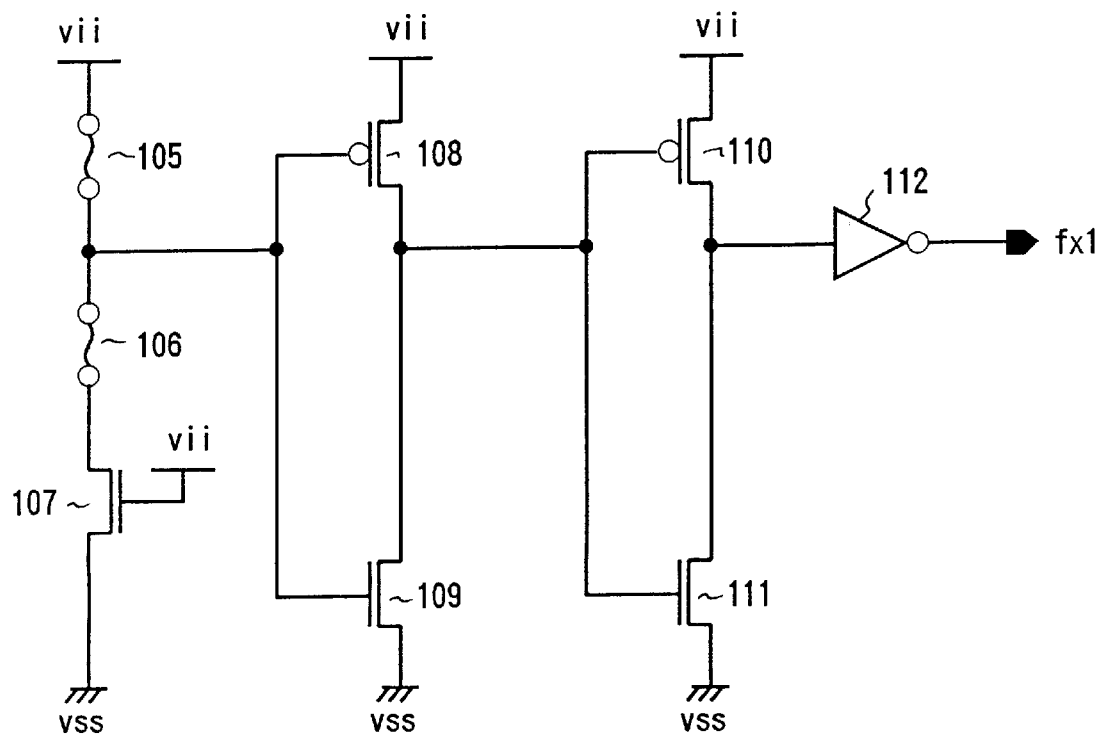

FIG. 16

| d c a 0 8 z | d c a 0 9 z | LOW-LEVEL OUTPUT TERMINAL |
|---|---|---|
| L | L | 1 0 5 |
| H | L | 1 0 6 |
| L | H | 1 0 7 |
| H | H | 1 0 8 |

SEMICONDUCTOR INTEGRATED CIRCUIT

BACKGROUND OF THE INVENTION

1. Field of the Invention

The present invention generally relates to semiconductor integrated circuits, and particularly to a semiconductor integrated circuits which has a plurality of circuits that operate in synchronism with a timing signal in parallel formation and the number of circuits operating in parallel is changed in accordance with an operation mode. More particularly, the present invention is concerned with a semiconductor device which operates in synchronism with an external clock signal and handles input or output data having a variable data length, such as a synchronous dynamic random access memory (SDRAM).

2. The Description of the Related Art

A semiconductor device is designed to form, on a chip, a circuit arrangement which makes it possible to implement a plurality of functions, which can selectively be operated by a mode instruction signal from the outside of the device or by changing interconnections in order to reduce the production cost and quickly meet requirements in the markets. For example, there has been considerable activity in increasing the integration density of a semiconductor memory device such as a DRAM. However, the conventional one-bit data width does not efficiently use an increased memory capacity per chip. Hence, the data width is generally designed to have a multiple-bit arrangement. Nowadays, DRAMs are available which have various data widths (bit widths) such as a 1-bit data width, a 4-bit data width, an 8-bit data width and a 16-bit data width. Generally, a given part such as a memory cell array is commonly used to the DRAMs having the different data widths, and an input/output part is selectively driven in accordance with the data width to be used. Hence, the different types of memory devices having the different data widths can be produced from one chip. A multiple-bit-data-width memory device is equipped with an internal circuit capable of setting the data width to be used and is then shipped.

Another multiple-bit-data-width memory device is equipped with an internal circuit capable of, during operation, arbitrarily setting the desired data width in response to an external mode instruction signal.

The bit-multiplication of the data width requires an arrangement in which a plurality of memory cells can be accessed by the same address in accordance with the data width. For example, a first arrangement activates a plurality of column lines and/or a plurality of word lines in response to a single address. A second arrangement groups a plurality of memory cells into a plurality of blocks (banks), which can be simultaneously accessed. A combination of the first and second arrangements can be used.

A change of the data width requires that a part of write (input) data is inhibited from being written into memory cells in the data write operation and a part of read (output) data is inhibited from be read from memory cells and output to data output terminals in the data read operation. The above inhibiting process is referred to as a mask process. In the mask process performed in the data write operation, data to be masked is prevented from being written into memory cells, and associated word lines and/or column lines are not activated. Hence, the mask process for write data is performed in an address decoder or a circuit around the address decoder. In a case whether the mask process is performed on the block basis, an access to a block to be masked is stopped.

In contrast, a particular problem does not occur in the data read operation even when the memory cells are normally accessed. Hence, it is enough to stop some data output circuits from outputting data. Even in the case where the mask process is performed on the block basis, it is required to stop the data output circuits of the blocks to be masked outputting data.

FIG. 1 is a block diagram of a conventional DRAM having the function of masking output data, and a structure of a data output circuit is illustrated in detail. The DRAM device illustrated shown in FIG. 1 is an SDRAM device in which the data input/output operation and internal operations are performed in synchronism with a clock signal externally applied thereto in order to operate the DRAM device at a high speed. An intermediate operation is a pipeline operation of a plurality of stages.

The SDRAM device shown in FIG. 1 includes a plurality of blocks 8-0–8-n, each of which blocks includes a memory cell array 1, a sense amplifier 17 and a data amplifier 18. Although not illustrated, each of the blocks further includes the same circuits as those of the conventional DRAM device, that is, an address decoder (which includes a row decoder and a column decoder), a driver and a write amplifier. Data output circuits 20-0–20-n are respectively provided to the blocks 8-0–8-n.

At the time of reading data, a memory cell of the memory cell array 1 specified by an address signal is accessed and data stored in the specified memory cell is amplified. Further, the data is amplified by a data amplifier 18, which outputs complimentary data signals to the output circuit 20-0. The complementary data signals are input to transfer gates 44 and 45 via inverters 41 and 42, respectively. The transfer gates 44 and 45 are open while an output timing signal clko is at a high level, and respectively transfer the output signals of the inverters 41 and 42 to a flip-flop made up of inverters 46 and 47 and a flip-flop made up of inverters 48 and 49. The output signals of the inverters 41 and 42 have been settled when the transfer gates 44 and 45 are opened, and are thus transferred to the two flip-flops when the transfer gates 44 and 45 are opened. The output signals of the two flip-flops are applied to gates of output transistors 50 and 51, which are switched to respective states corresponding to the output signals of the flip-flops. If the transistor 50, which is a p-channel transistor, is turned on, the transistor 51, which is an n-channel transistor, is turned off, so that a high-level data signal is output to an output terminal 53-0. The same operation as described above is performed in each of the other output circuits 20-1–20-n.

The transfer gates 44 and 45 are in the closed state while the output timing signal clko is at a low level, and maintain states obtained when the transfer gates 44 and 45 are closed until the transfer gates 44 and 45 are opened again. The output timing signal clko is a signal synchronized with a clock signal externally applied to the SDRAM device.

A mask control signal dm is applied to the block 20-0. Similarly, mask control signals are respectively applied to the blocks 20-1–20-n. The mask control signal dm applied to the block 20-0 determines whether the block 20-0 should output data. When the mask control signal dm is at the high level, the transfer gates 44 and 45 output the received data signals in synchronism with the output timing signal clko. That is, the block 20-0 is set to an enabled (active) state. When the mask control signal dm is at the low level, the transfer gates 44 and 45 are continuously in the closed state and output no data signals. That is, the block 20-0 is set to a disabled (inactive) state. The mask control signal dm is generated by a control circuit, which is not shown in FIG. 1. The above control circuit receives mask data from the outside of the SDRAM device, and generates the mask block signals dm respectively supplied to the blocks 20-0–20 -n.

FIGS. 2A and 2B respectively illustrate arrangements for masking output data. By way of example, each of the arrangements includes four blocks and output circuits. The combination of four blocks and four output circuits is common to the SDRAM devices having different specifications. The arrangement shown in FIG. 2A is applied to an SDRAM device which has data output terminals 53-0–53-3 that are equal in number to the blocks 8-0–8-3 and the output circuits 20-0–20-3. In the arrangement shown in FIG. 2A, the output circuits 20-0–20-3 are respectively connected to the data output terminals 53-0–53-3. The arrangement shown in FIG. 2B is applied to an SDRAM device which has a single data output terminal 53 with regard to the blocks 8-0–8-3 and the output circuits 20-0–20-3. In the arrangement shown in FIG. 2B, blocks 1-0–1-3 are connected to only the output circuit 20-0, which is connected to the data output terminal 53. In this case, the mask control signals dm applied to the output circuits 20-1–20-3 are low, so that the output circuits 20-1–20-3 can be prevented from outputting data.

In order to arbitrarily set the data width by the mode instruction signal externally supplied, the arrangement shown in FIG. 2A is modified so that the mask control signals dm applied to the output circuits 8-0–8-3 can be controlled. When the data width is changed, the number of output circuits to be activated is changed.

However, the above-mentioned conventional memory device has the following disadvantages. The output timing signal clko is constant irrespective of the number of output circuits to be activated. However, in practice, the time it takes data to be output from the output circuits depends on the number of output circuits to be activated. This is because a drop of the power supply voltage and/or the influence of noise depend on the number of output circuits to be activated.

FIG. 3 shows changes of output data with respect to the output timing signal clko. Output data Dout is obtained when the output data width is short, and a small number of output circuits is activated. In contrast, output data Dout' is obtained when the output data width is long, and a large number of output circuits is activated. When a large number of output circuits is activated, a large power supply drop and large noise occur. Hence, the time t2 it takes the output data Dout' to be changed after the output timing signal clko rises is longer than the time t1 it takes the output data Dout to be changed after the output timing signal clko rises. When a small number of output circuits is activated, the reset time for output data is short and the data hold time is thus reduced.

As described above, the data is output at the different timings based on the number of output circuits to be activated.

Generally, the frequency of the clock is determined taking into account the dispersion of the data output timing dependent on the number of output circuits to be activated. Hence, it is very difficult to increase the clock frequency. The above disadvantages occur not only in the SDRAM devices but also in semiconductor devices in which the number of circuits to be activated is changed and the operation timings are thus changed.

SUMMARY OF THE INVENTION

A general object of the present invention is to provide a semiconductor integrated circuit in which the above disadvantages are eliminated.

A more specific object of the present invention is to provide a semiconductor integrated circuit capable of operating at a higher frequency.

The above objects of the present invention are achieved by a semiconductor integrated circuit comprising: a plurality of circuits operating in parallel in accordance with a timing signal, the plurality of circuits having an enabled state and a disabled state; a control circuit setting each of the plurality of circuits to the enable state or the disabled state in accordance with an operation mode; and a timing adjustment circuit adjusting the timing signal in accordance with a number of circuits which are in the enabled state. Hence, it is possible to operate the circuits in parallel in accordance with an adjusted timing signal so that data can be output from the circuits irrespective of the number of circuits which are in the enabled state.

BRIEF DESCRIPTION OF THE DRAWINGS

Other objects, features and advantages of the present invention will become more apparent from the following detailed description when read in conjunction with the accompanying drawings, in which:

FIG. 10 is a circuit diagram of a mode memory circuit shown in FIG. 9;

FIG. 16 is a diagram showing a relationship between decoded column address signals and an output terminal via which a low-level signal is obtained;

DESCRIPTION OF THE PREFERRED EMBODIMENTS

A description will be given of SDRAMs according to embodiments of the present invention. It is to be noted that the present invention includes not only SDRAMs but also semiconductor devices or circuits in which the number of circuits to be activated can be changed and the operation timings are thus changed.

A first embodiment of the present invention is an SDRAM device or chip has an output data width which can be switched to 16 bits, 8 bits or 4 bits. That is, 16 memory cells can be simultaneously accessed in parallel, and 16 data output circuits are provided. The setting of the output data width can be performed from the outside of the SDRAM device, and each of the data output circuits can be activated or inactivated. The SDRAM device has 16 blocks (cores). When the output data width is set to 16 bits, memory cells in the 16 blocks are simultaneously accessed in parallel. An alternative arrangement can be made. For example, only four blocks out of the 16 blocks are accessed in parallel, and four memory cells in the four accessed blocks are simultaneously accessed in parallel.

Figure 4:
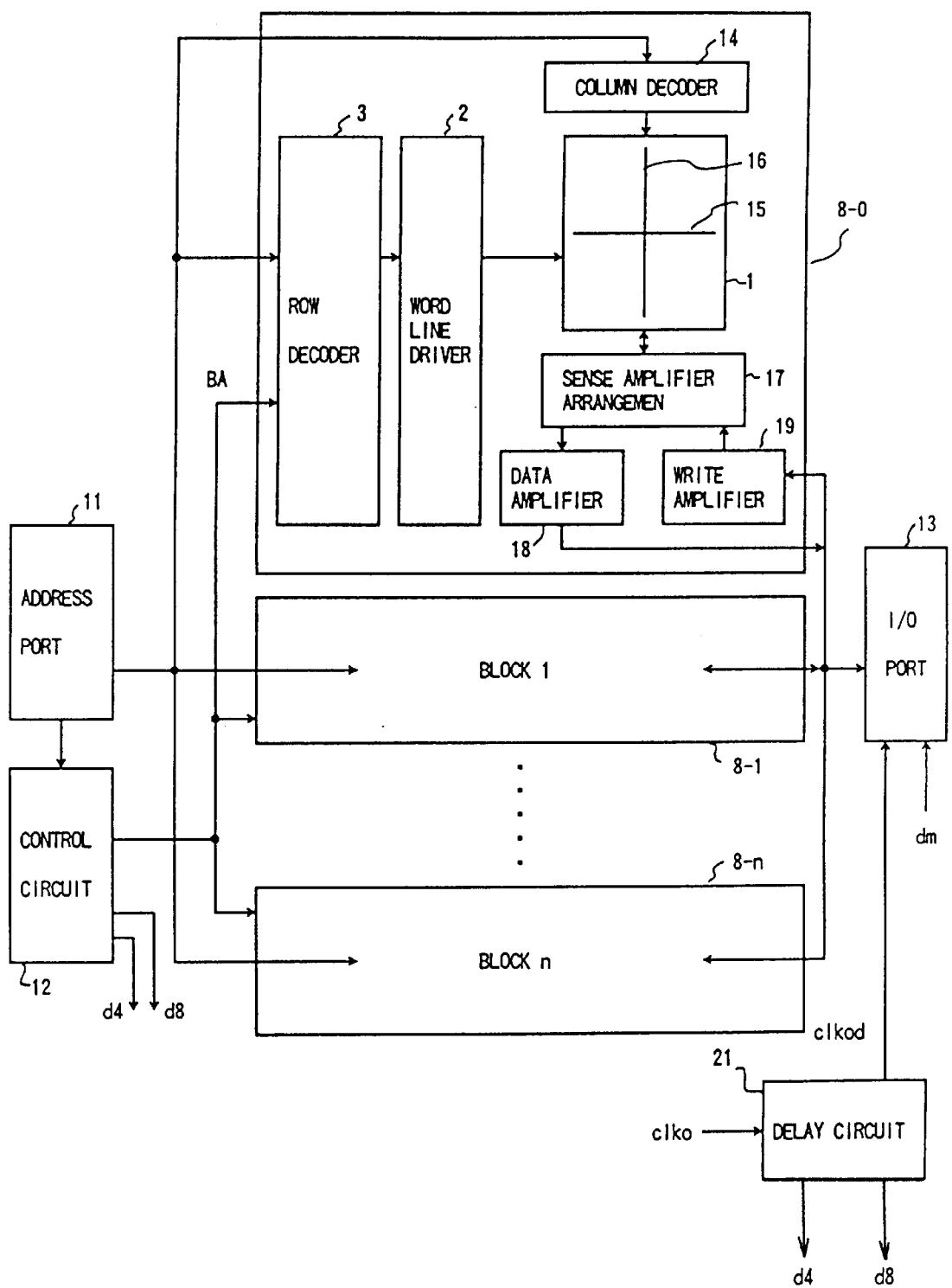
FIG. 4 is a block diagram of an SDRAM according to a first embodiment of the present invention.

FIG. 4 is a block diagram of an overall structure of the SDRAM device according to the first embodiment of the present invention. An address signal applied to an address port 11 is supplied to a row decoder 3 and a column decoder 14 of each block. A row select signal output by the row decoder 3 is applied to a word line 15 via word line driver 2, so that the word line 15 selected is activated and the other word lines 15 are inactivated. A column select signal output by the column decoder 14 is applied to a sense amplifier arrangement 17, which activates a sense amplifier connected to a bit line to which a memory cell to be accessed is connected, while the other bit lines are inactivated.

The address signal applied via the address port 11 and control signals are applied to a control circuit 12, which generates internal control signals and supplies these signals to the blocks. Examples of the above control signals are a row address strobe signal /RAS, a column address strobe signal /CAS, a chip select signal /CS and a write enable signal /WE. At the time of writing data, write data input to an input/output port 13 is supplied to the sense amplifier arrangement 17, so that the activated sense amplifier sets the bit line to the potential based on the write data. A charge corresponding to the potential of the bit line is stored in the memory cell connected to the selected word line. At the time of reading data, the state of the bit line is changed in accordance with the charge stored in the memory cell connected to the selected word line. The activated sense amplifier amplifies the state of the bit line. The data amplifier 18 outputs the sensed state to the I/O port 13. Hence, the output circuit and the terminal are included in the I/O port 13.

According to the first embodiment of the present invention, a delay circuit 21, which serves as a timing adjustment circuit, is provided which adjusts the output timing signal clko supplied to the I/O port 13, and generates delay control signals d4 and d8 based on the output data width.

Figure 1:
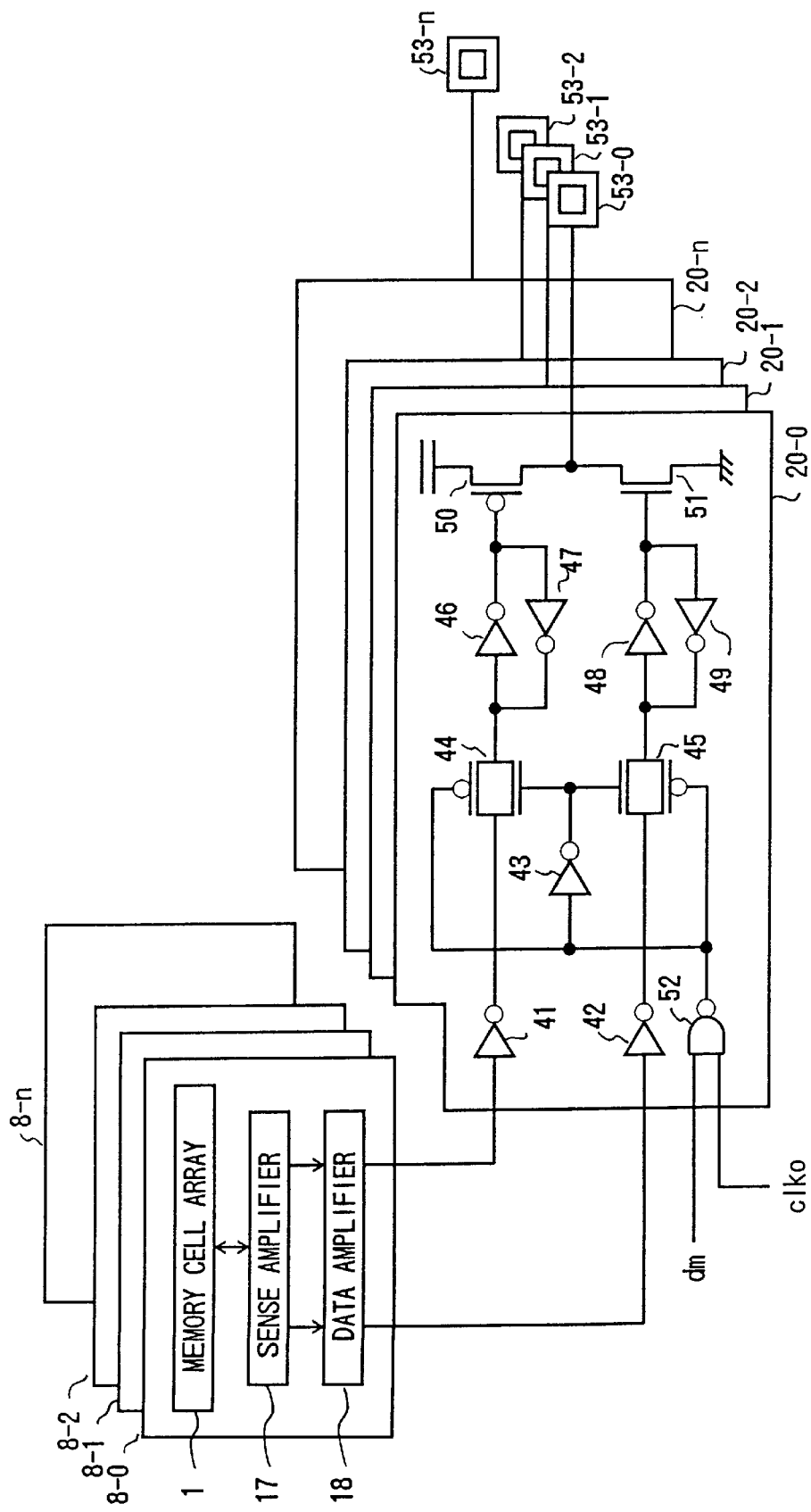
FIG. 1 is a block diagram of a conventional DRAM device having an output data masking function.
Figure 2A:
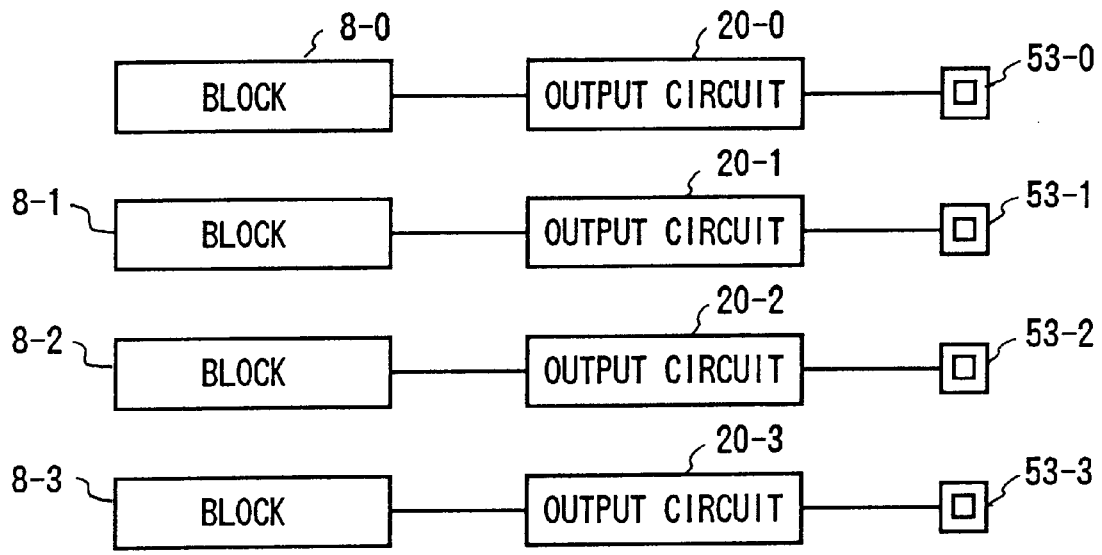
FIGS. 2A and 2B are respectively diagrams showing the output data masking function.
Figure 2B:
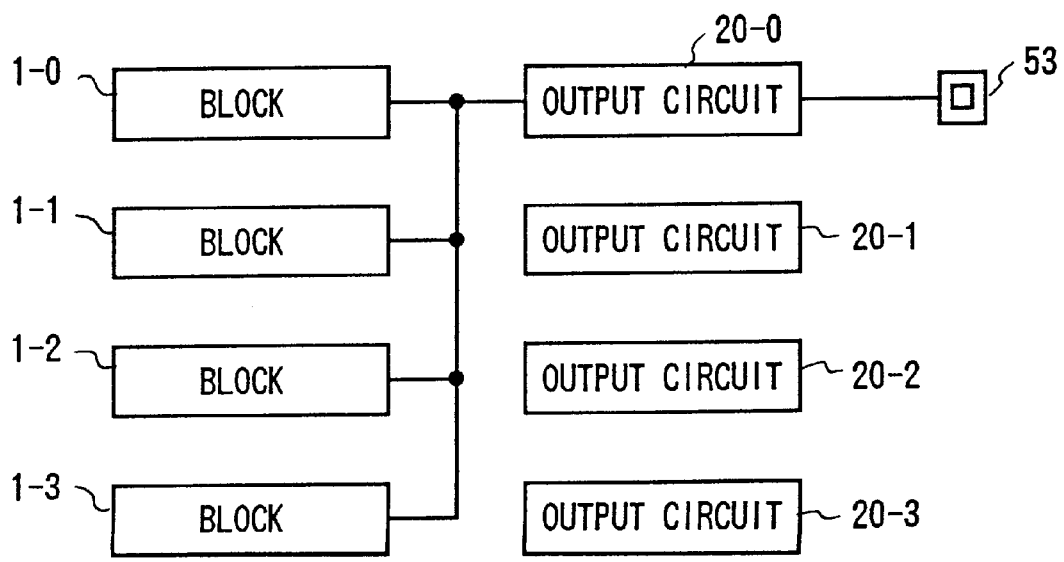
Figure 3:
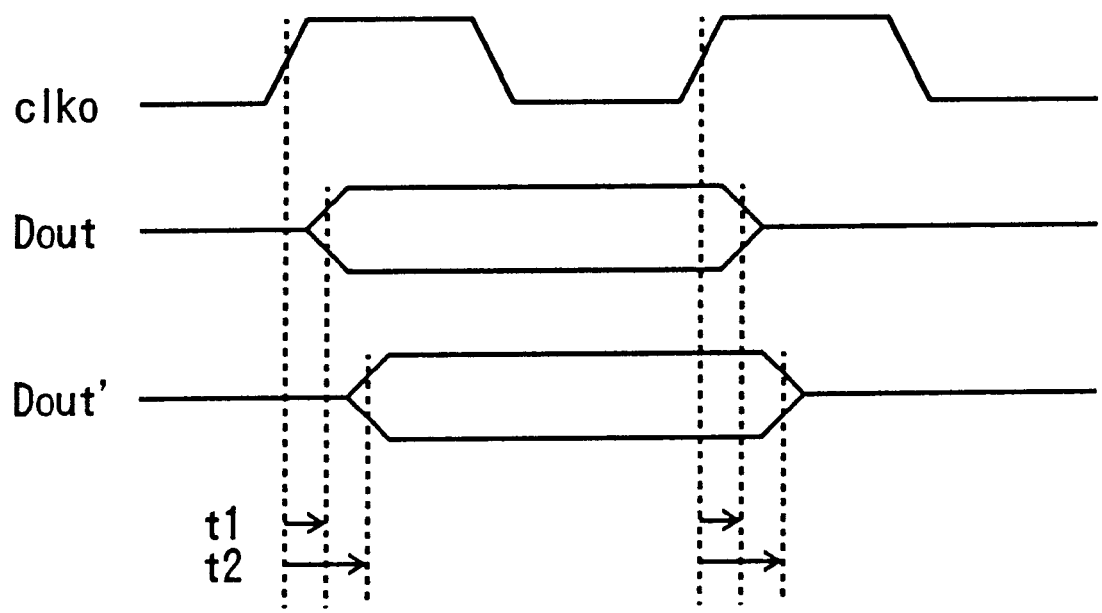
FIG. 3 is a timing chart showing a data output timing of the conventional DRAM device.
Figure 5:
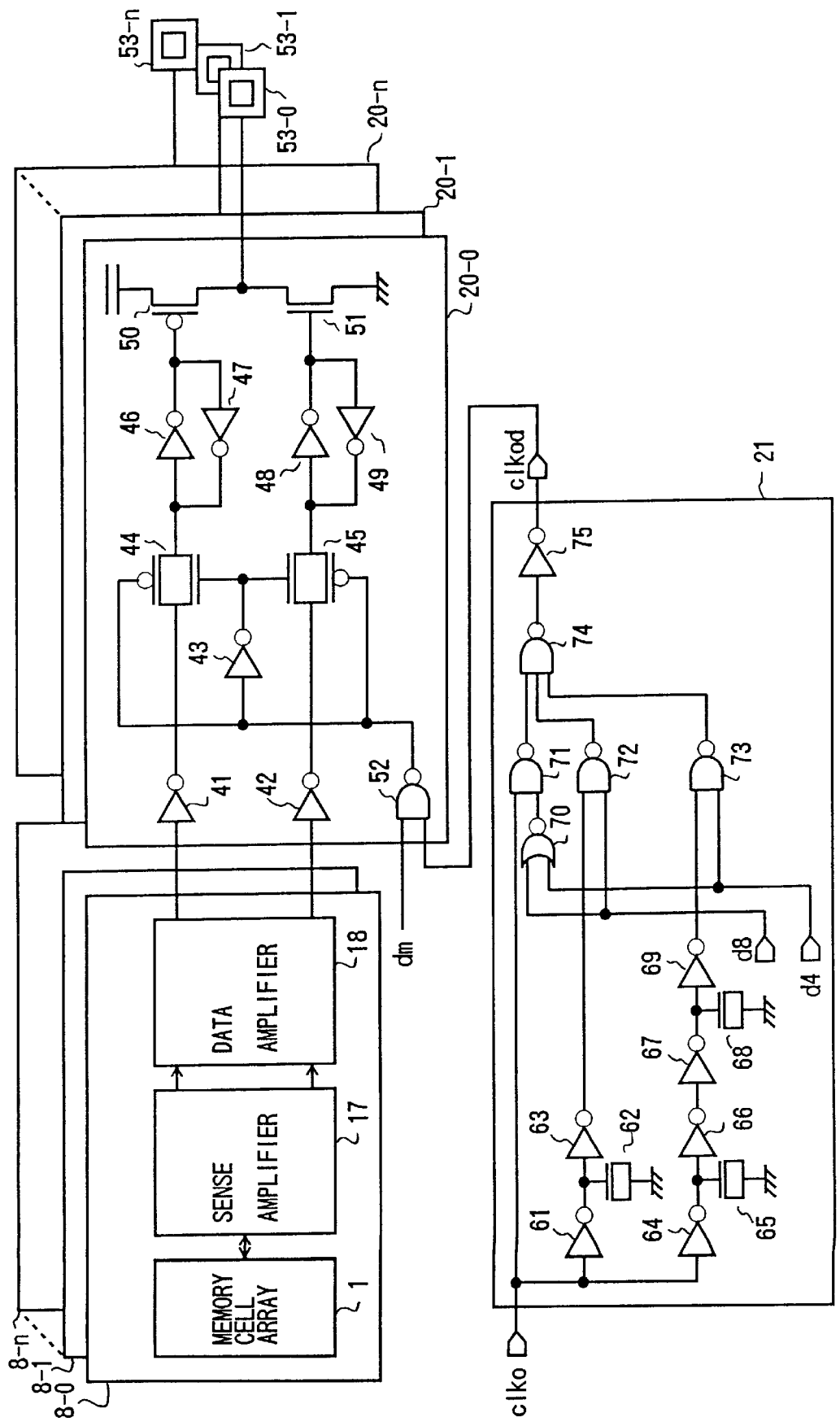
FIG. 5 shows a detailed illustration of an output circuit and a delay circuit (timing adjustment circuit) provided in the SDRAM shown in FIG. 4.

FIG. 5 is a diagram of output circuits of the SDRAM device shown in FIG. 4 and circuits associated with the output circuits. In FIG. 5, parts that are the same as those shown in FIG. 1 are given the same reference numbers. The configuration shown in FIG. 5 differs from that shown in FIG. 1 in that the output timing signal clko supplied to the output circuits 20-0–20-n is a delayed output timing signal clkod having a delay amount adjusted by the delay circuit 21.

The delay control signals d4 and d8 supplied to the delay circuit 21 are generated as shown in FIG. 4. When the output data width is equal to 16 bits, the delay control signals d4 and d8 are both low. When the output data width is equal to 8 bits, the delay control signals d8 and d4 are high and low, respectively. When the output data width is equal to 4 bits, the delay control signals d4 and d8 are respectively high and low. When the delay control signals d4 and d8 are both low, the output signal of a NOR gate 70 is high. Thus, the output timing signal clko input to the delay circuit 21 passes through a NAND gate 71, and further passes through a NAND gate 74 and an inverter 75. The output signal of the inverter 75 serves as the delayed output timing signal clkod. When the delay control signals d8 and d4 are high and low, respectively, the output signal of the NOR gate 70 is low. Thus, the output timing signal clko applied to the delay circuit 21 passes through a first delay circuit made up of inverters 61 and 63 and a capacitor 62, and further passes through the NAND gate 74 and the inverter 75. Thus, the delayed output timing signal clkod obtained when the signals d8 and d4 are respectively high and low lags behind that obtained when the signals d8 and d4 are both low by the delay amount of the first delay circuit.

When the delay control signals d4 and d8 are respectively high and low, the output signal of the NOR gate 70 is low. Thus, the output timing signal clko input to the delay circuit 21 passes through a second delay circuit made up of inverters 64 and 66 and a capacitor 65, and further passes through a third delay circuit made up of inverters 67 and 69 and a capacitor 68. Then, the output signal of the inverter 69 passes through a NAND gate 73, and further passes through the NAND gate 74 and the inverter 75. If the first and second delay circuits have the same delay amount, the delayed output timing signal clkod obtained when the signals d4 and d8 are respectively high and low lags behind that obtained when the signals d8 and d4 are respectively high and low by the delay amount of the third delay circuit. The delay amounts of the first, second and third delay circuits can be determined in accordance with a variation in the delay amount of the data output circuit dependent on the output data width.

Figure 6:
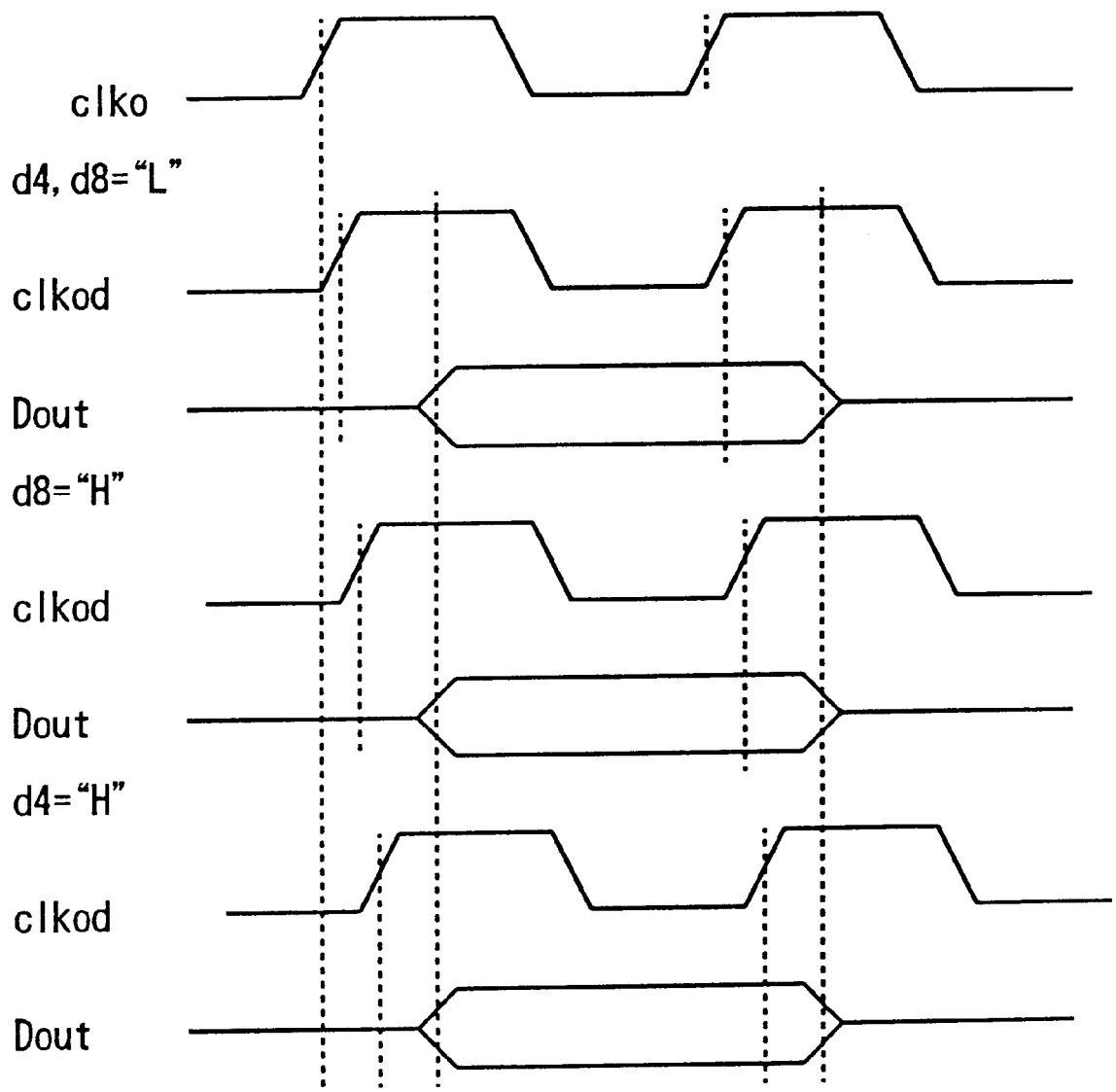
FIG. 6 is a timing chart of a data output operation in the first embodiment of the present invention.

FIG. 6 is a timing chart of the data output of the first embodiment of the present invention. When the output data width is equal to 16 bits, the delay control signals d4 and d8 are set low, the delayed output timing signal clkod has the minimum delay amount. However, the delay caused when the output circuits 20-0–20-n output data in synchronism with the delayed output timing signal clkod is the largest. Hence, the output data Dout is changed as shown in FIG. 6. The output timing signal clko is set taking into consideration the delay of the delay circuit 21 so that the delayed output timing signal clkod has the desired timing.

When the output data width is equal to 8 bits, the delay control signals d8 and d4 are respectively set high and low. The delayed outut timing signal clkod has an intermediate delay amount. Hence, the output circuits 20-0–20-n output data with an intermediate delay in synchronism with the delayed output timing signal clkod. When the first delay circuit has an appropriate delay amount, the output data Dout changes at the same timing as that obtained when the delay control signals d4 and d8 are both low.

When output data width is equal to 4 bits, the delay control signals d4 and d8 are set high and low, respectively. Thus, the delayed output timing signal clkod has the maximum delay amount. However, the delay caused when the output circuits 20-0–20-n output data in synchronism with the delayed output timing signal clkod is the smallest. Hence, when the third delay circuit has an appropriate delay amount, the output data Dout changes in the same manner as that in the other cases.

As described above, according to the first embodiment of the present invention, the output data changes at the constant timing irrespective of the output data width.

Figure 7:
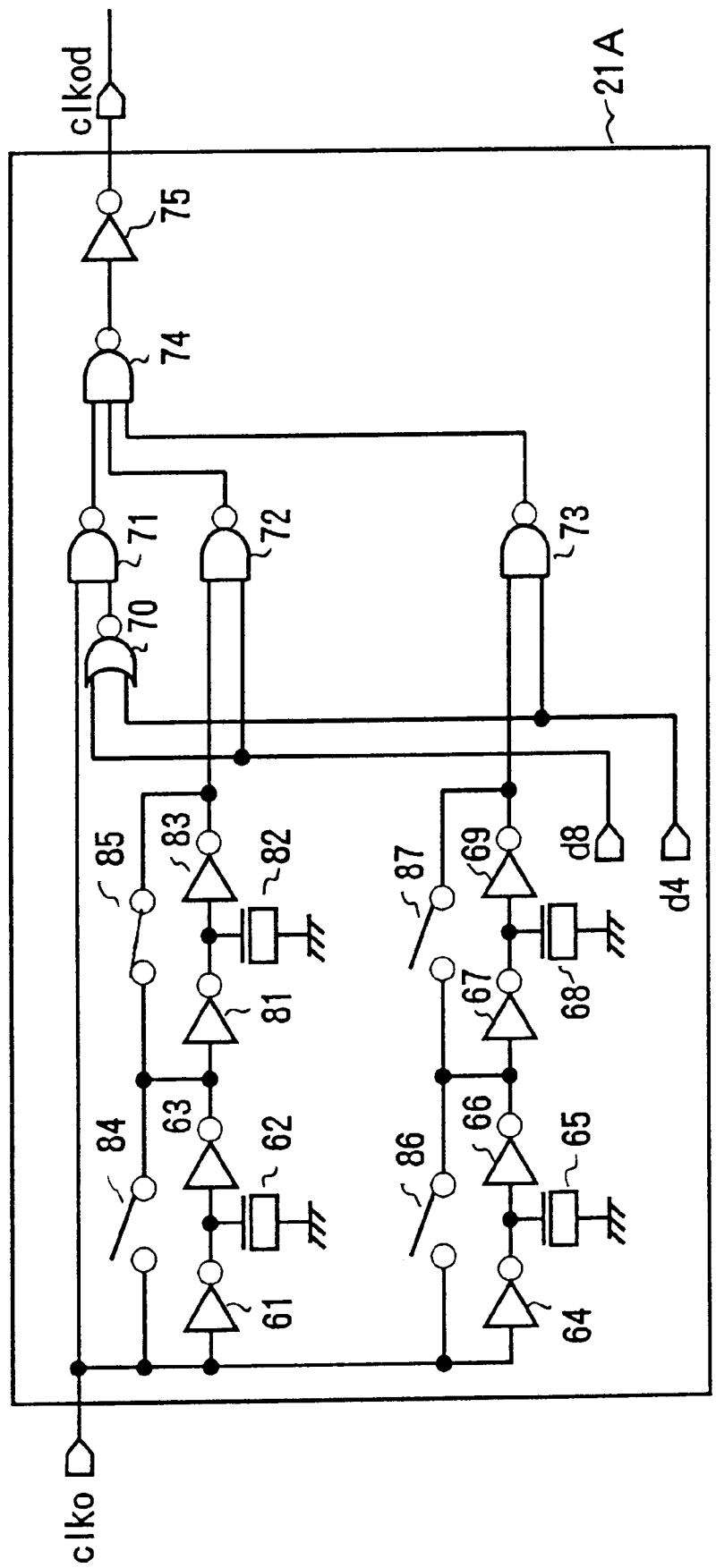
FIG. 7 is a circuit diagram showing a configuration of the output circuit different from that shown in FIG. 5.

FIG. 7 shows a variation 21A of the delay circuit 21, in which parts that are the same as those shown in FIG. 5 are given the same reference numbers. In addition to the aforementioned first through third delay circuits, the delay circuit 21A has a fourth delay circuit made up of inverts 81 and 83 and a capacitor 82. Switches 84–87 are provided to the first through fourth delay circuits, respectively. When the switch 85 is closed and the switches 84, 86 and 87 are open, the delay circuit 21A is equivalent to the delay circuit 21. That is, each of the switches 84–87 has the function of bypassing the respective delay circuit. The delay system from the input terminal supplied with the output timing signal clko to the NAND gate 72 is the same as the delay system from the input terminal to the NAND gate 73. Hence, the single pattern can be used to form the delay systems. The switches 84–87 can be formed of fuses, transistors or the like.

It is possible to omit one of the delay systems or circuits from the configuration shown in FIG. 7. In this case, the switches are formed of transistors and are controlled by control signals based on the delay control signals d4 and d8.

In the first embodiment of the present invention, the mode instruction signal indicative of the output data width is input from the outside of the SDRAM device, and the control circuit 12 which receives the mode instruction signal generates the delay control signals d4 and d8.

Figure 8:
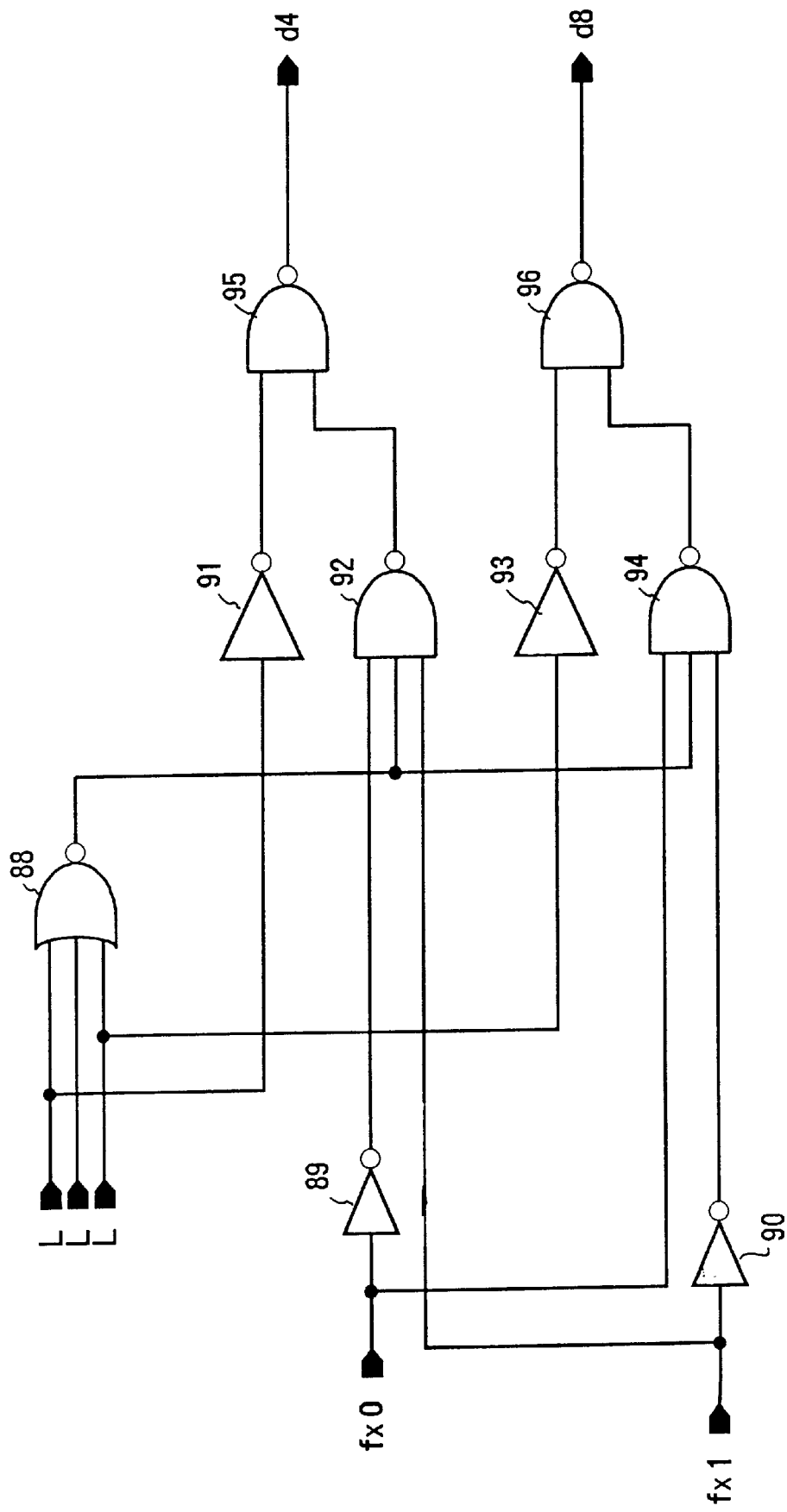
FIG. 8 is a circuit diagram of a delay control signal generating circuit provided in a control circuit shown in FIG. 4.

FIG. 8 is a circuit diagram of a delay control signal generating circuit provided in the control circuit 12. The delay control signal generating circuit shown in FIG. 8 generates the delay control signals d4 and d8 from signals fx0 and fx1. The delay control signal generating circuit is made up of a NOR gate 88, inverters 89, 90, 91 and 93, and NAND gates 92, 94, 95 and 96. In the first embodiment of the present invention, the signals fx0 and fx1 are supplied from the outside of the SDRAM device as the mode instruction signal. The timing control signal generating circuit operates as shown in Table 1.

TABLE 1

|     | x16 | x8 | x4 |   |
|-----|-----|----|----|---|
| fx0 | L   | H  | L  | H |
| fx1 | L   | L  | H  | H |
| d4  | L   | L  | H  | L |
| d8  | L   | H  | L  | L |

H: high level
L: low level

The output data width can be changed during an operation of the SDRAM device by applying the mode instruction signal to the delay control signal generating circuit shown in FIG. 8. Generally, in order to handle data having a large data width at a high speed, it is required to connect the memory device to a CPU by means of a wide data bus. Nowadays, such a wide data bus has a 16-bit (2-byte) data bus width or a 32-bit (4-byte) data bus width. If 64-bit data is read from the memory or written therein, the 64-bit data is transferred between the memory and the CPU four times with the data width equal to 16 bits and twice with the data width equal to 32 bits. The use of the wide data bus is advantageous to data having a wide data width. However, in order to handle data having a narrow data width, it is required to prepare, on the data bus, data having the same data width as the above narrow data width. For example, there is a case where only part of an image has a movement and the remaining part thereof does not have any movement. In such a case, image data related to only the image part having a movement is read from or written into the memory by using a part of the data bus. In this case, the mask function is applied so that unnecessary image data are output and transferred via the bus. Hence, it is required to change the output data width during operation.

However, if a semiconductor device is used in which a core is provided common to a plurality of output data widths and a desired one of the output data widths can be obtained by merely changing an internal interconnection line such as a bonding line or a fuse, it is not required to change the output data bus during operation. A second embodiment of the present invention is such a semiconductor device.

Figure 9:
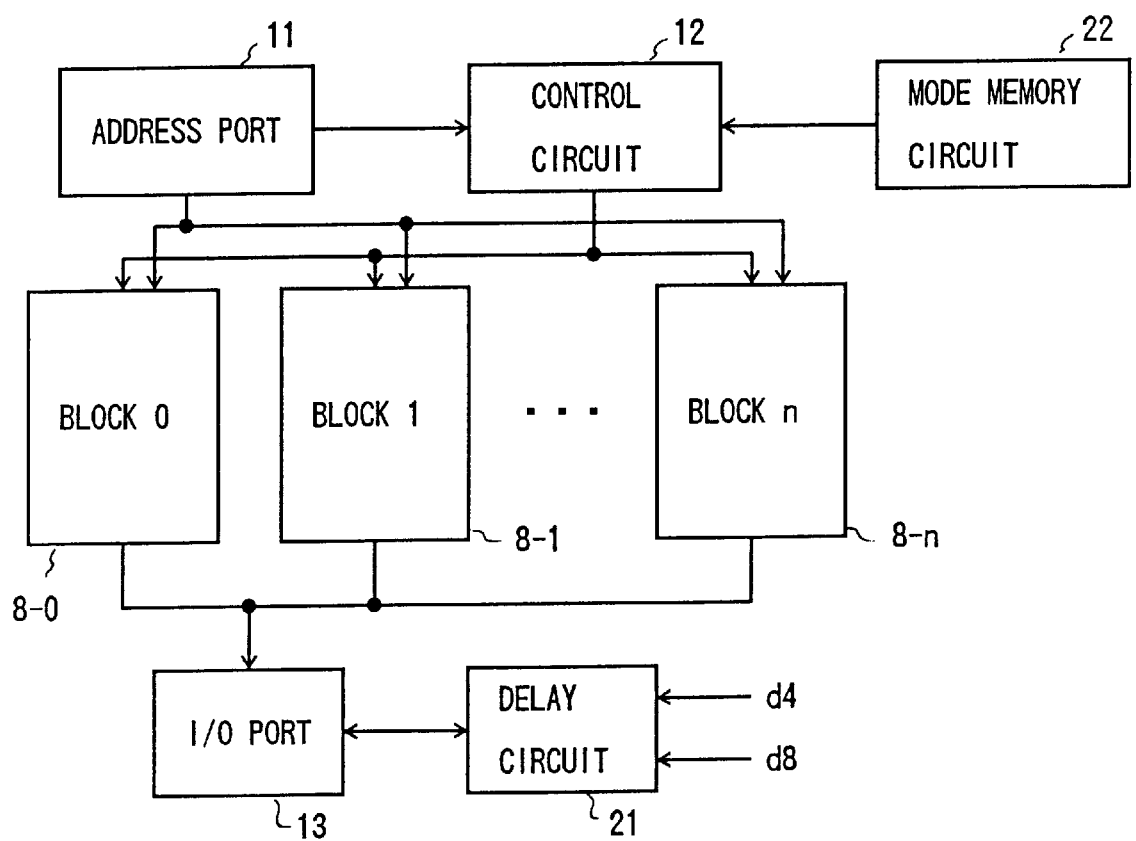
FIG. 9 is a block diagram of an SDRAM according to a second embodiment of the present invention.

FIG. 9 is a block diagram of an SDRAM device according to the second embodiment of the present invention. In FIG. 9, parts that are the same as those shown in the previously described figures are given the same reference numbers. The second embodiment shown in FIG. 9 differs from the first embodiment shown in FIG. 4 in that the second embodiment has a mode memory circuit 22, which stores the output data width to be used. At the time of power-on reset, the control circuit 12 reads the output data width stored in the mode memory circuit 22. In other words, the aforementioned signals fx0 and fx1 are read from the mode memory circuit 22 and are applied to the delay control signal generating circuit shown in FIG. 8 at the time of power-on reset.

FIG. 10 is a circuit diagram of the mode memory circuit 22. The signal fx0 is generated by a circuit made up of fuses 97 and 98, p-channel MOS transistors 100 and 102, n-channel MOS transistors 99, 101 and 103, and an inverter 104. Similarly, the signal fx1 is generated by a circuit made up of fuses 105 and 106, p-channel MOS transistors 108 and 110, n-channel MOS transistors 107, 109 and 111, and an inverter 112. A symbol Vii denotes a power supply voltage, and Vss denotes the ground potential. The fuses 97, 98, 105 and 106 are selectively cut in accordance with the desired output data width. Table 2 shows a relationship between the fuses and the signals fx0 and fx1.

TABLE 2

| 97  | —   | —   | cut | cut |
|-----|-----|-----|-----|-----|
| 105 | —   | —   | cut | cut |
| 98  | —   | cut | —   | cut |
| 106 | —   | cut | —   | cut |
| fx0 | L   | L   | H   | ?   |
| fx1 | L   | L   | H   | ?   |

—: not cut

As has been described previously, the signals fx0 and fx1 are set low and high, respectively, when the output data width is equal to 4 bits. Hence, the fuses 97 and 106 are cut. When the output data width is equal to 8 bits, the signals fx0 and fx1 are high and low, respectively. Hence, the fuses 98 and 105 are cut. When the output data width is equal to 16 bits, the signals fx0 and fx1 are both low. Hence, none of the fuses are cut or only fuses 98 and 106 are cut.

Instead of the fuses, bonding wires can be used. The bonding wires are not provided to the portions in which the fuses should be cut.

Figure 11:
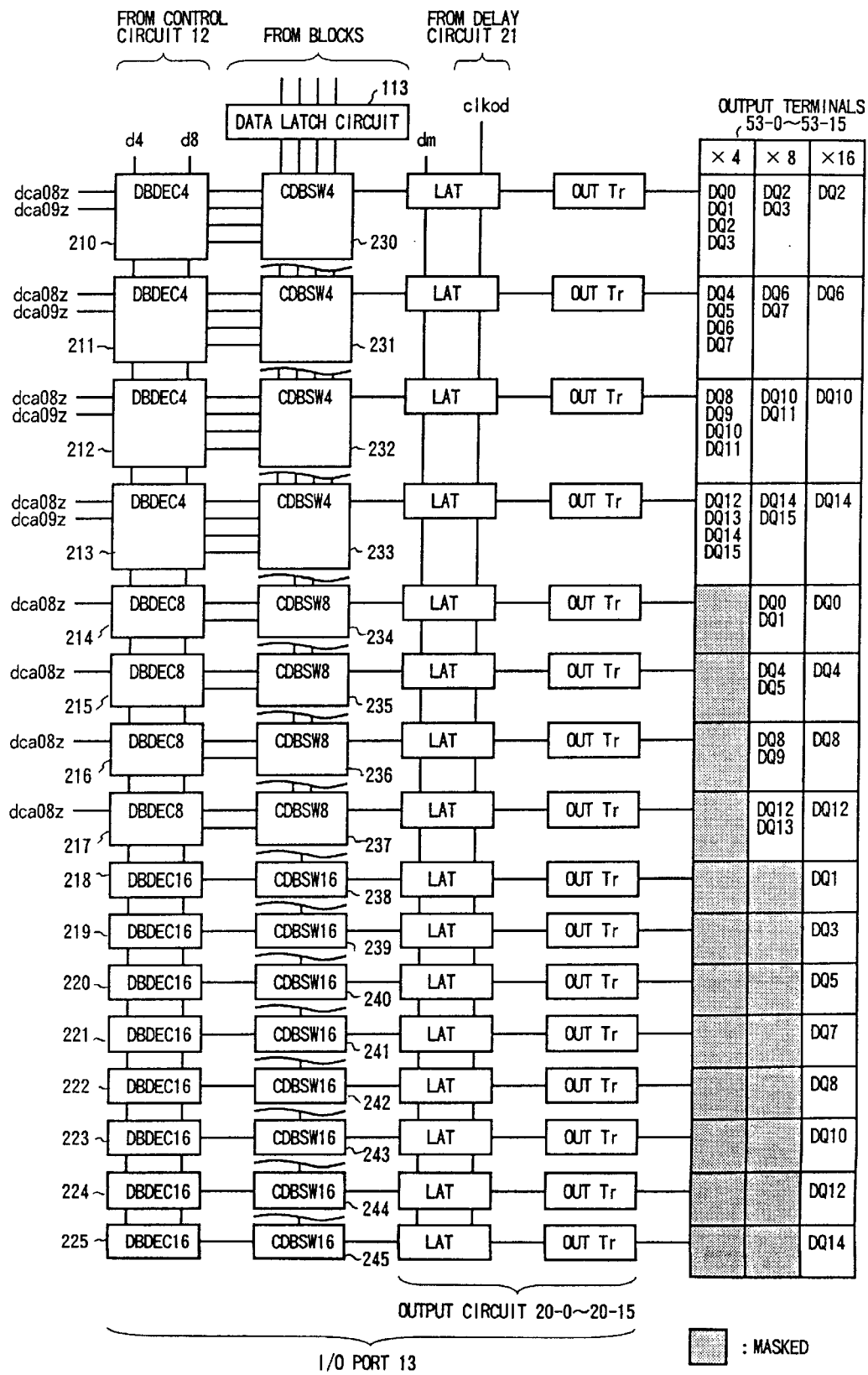
FIG. 11 is a block diagram of an I/O port shown in FIG. 4.

FIG. 11 is a block diagram of a structure of the output system of the I/O port 13 where the SDRAM device has 16 blocks, or banks (n=16). As shown in FIG. 11, the I/O port 13 includes data bus decoders (DBDEC) 210–225, common data bus switches (CDBSW) 230–245, latch circuits LAT, output transistor parts OUT_Tr, and output terminals 53-0–53-15. The latch circuits LAT and the output transistor parts OUT_Tr form the aforementioned output circuits 20-0–20-15. The I/O port 13 is connected to the 16 blocks 8-0–8-15 not shown in FIG. 11 via a data latch circuit 113.

The common data bus switch (CDBSW4) 230 is connected to four pairs of data lines respectively extending from four blocks out of the 16 blocks. The common data bus switch 231 is connected to four pairs of data lines respectively extending from four blocks out of the 16 blocks different from the four blocks connected to the switch 230. The common data bus switch 232 is connected to four pairs of data lines respectively extending from four blocks out of the 16 blocks different from the blocks connected to the switches 230 and 231. The common data bus switch 233 is connected to four pairs of data lines respectively extending from the four remaining blocks out of the 16 blocks. The common data bus switches 230–233 perform switching operations on the pairs of data lines under the control of the data bus decoders 210–213.

Similarly, the common data bus switches (CDBSW8) 234–237 are connected to respective two pairs of data lines, and are controlled by the data bus decoders 214–217, respectively. The common data bus switches (CDBSW16) 238–245 are connected to respective pairs of data lines, and are controlled by the data bus decoders 218–225.

The data bus decoders 210–225 are supplied with the delay control signals d4 and d8. Further, the data bus decoders 210–213 are supplied with predetermined decoded column address signals dca08z and dca09z supplied from the column decoder 14. Each of the data bus decoders 210–213 decodes the delay control signals d4 and d8 in accordance with the decoded column address signals dca08z and dca09z, and outputs a switch control signal consisting of four bits to the respective common data bus switch CDBSW4.

When the output data width is set equal to 4 bits, the delay control signals d4 and d8 are respectively high and low. In this case, the switch control signal output by the decoder 210 instructs the switch 230 to select one pair of data lines from among the four pairs of data lines respectively extending from the four blocks associated with output data DQ0, DQ1, DQ2 and DQ3 obtained at the output terminals. When the output data width is set equal to 8 bits, the delay control signals d4 and d8 are respectively low and high. In this case, the switch control signal output by the decoder 210 instructs the switch 230 to select one of the two pairs of data lines extending from the two blocks associated with output data DQ2 and DQ3. When the output data width is set equal to 16 bits, the delay control signals d4 and d8 are both low. In this case, the switch control signal output by the decoder 210 instructs the switch 230 to select the pair of data lines extending from the block associated with output data DQ2.

The decoders 211–213 and the associated switches 231–233 operate in the same manner as described above.

Each of the decoders 214–217 decodes the delay control signals d4 and d8 in accordance with the decoded column address signal dca08z, and controls the respective switch CDBSW8. When the output data width is set equal to 8 bits, the switch control signal of the decoder 214 instructs the switch 234 to select one of the two pairs of data lines extending from the two blocks associated with DQ0 and DQ1. When the output data width is set equal to 16 bits, the switch control signal of the decoder 214 instructs the switch 234 to select the pair of data lines extending from the block associated with DQ0. When the output data width is set equal to 4 bits, the mask control signal dm prevents data from being output to the corresponding output terminals. The other decoders 215–217 and the associated switches 235–237 operate in the same manner as described above.

The decoders (DBDEC16) 218–255 and the associated common data bus switches (CDBSW16) 238–245 are used only when the output data width is equal to 16 bits. Each of the decoders 218–255 instructs the respective switch to have the corresponding pair of data line pass therethrough. When the output data width is equal to 8 bits or 4 bits, the mask control signal dm prevents data from being output to the corresponding output terminals.

The complementary data signals coming from the switches 230–245 are latched by the latch circuits LAT. Each of the latch circuits LAT is, as shown in FIG. 5, made up of the aforementioned inverters 41–43, transfer gates 44 and 45, two flip-flops composed of the inverters 46 and 47 and the inverters 48 and 49, and the NAND gate 52. Then, the complementary data signals latched are applied to the output transistor circuit OUT_Tr composed of the transistors 51 and 52.

Figure 12:
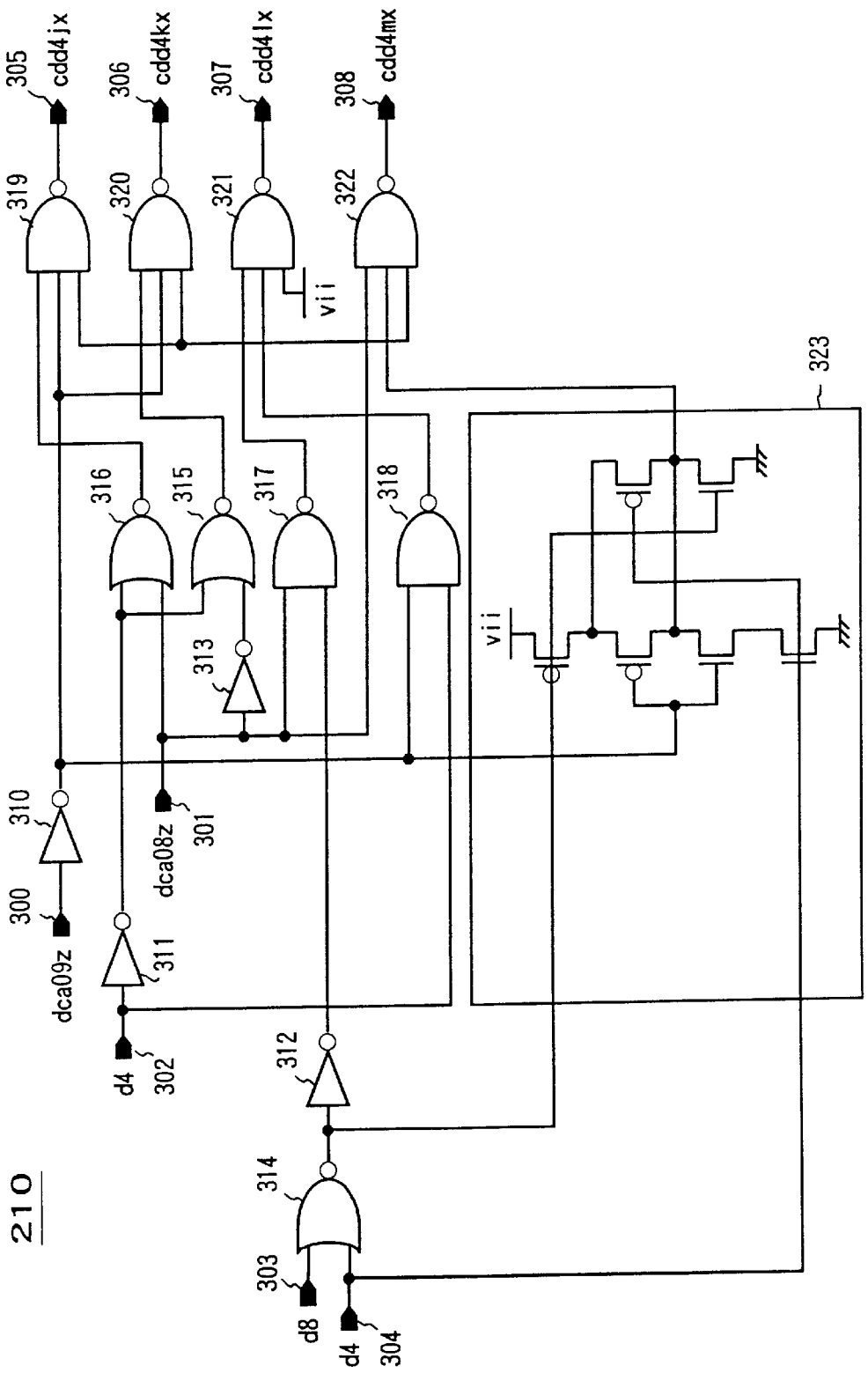
FIG. 12 is a circuit diagram of a 4-bit data bus decoder shown in FIG. 11.

FIG. 12 is a circuit diagram of the data bus decoder 210. Each of the other data bus decoders 211, 212 and 213 has the same configuration as shown in FIG. 12. As shown in FIG. 12, the data bus decoder 210 is made up of inverters (NOT circuits) 310–313, NOR circuits 314–316, NAND circuits 317–322 and a logic circuit 323. The logic circuit 323 determines whether the output data width is set equal to 16 bits. The delay control signal d4 is applied to input terminals 302 and 304. The delay control signal d8 is applied to an input terminal 303. The decoded column address signal dca08z is applied to an input terminal 301, and the decoded column address signal dca09z is applied to an input terminal 300. The switch control signal consisting of four bits cdd4jx, cdd4kx, cdd4lx and cdd4mx is output via output terminals 305–308.

Figure 13:
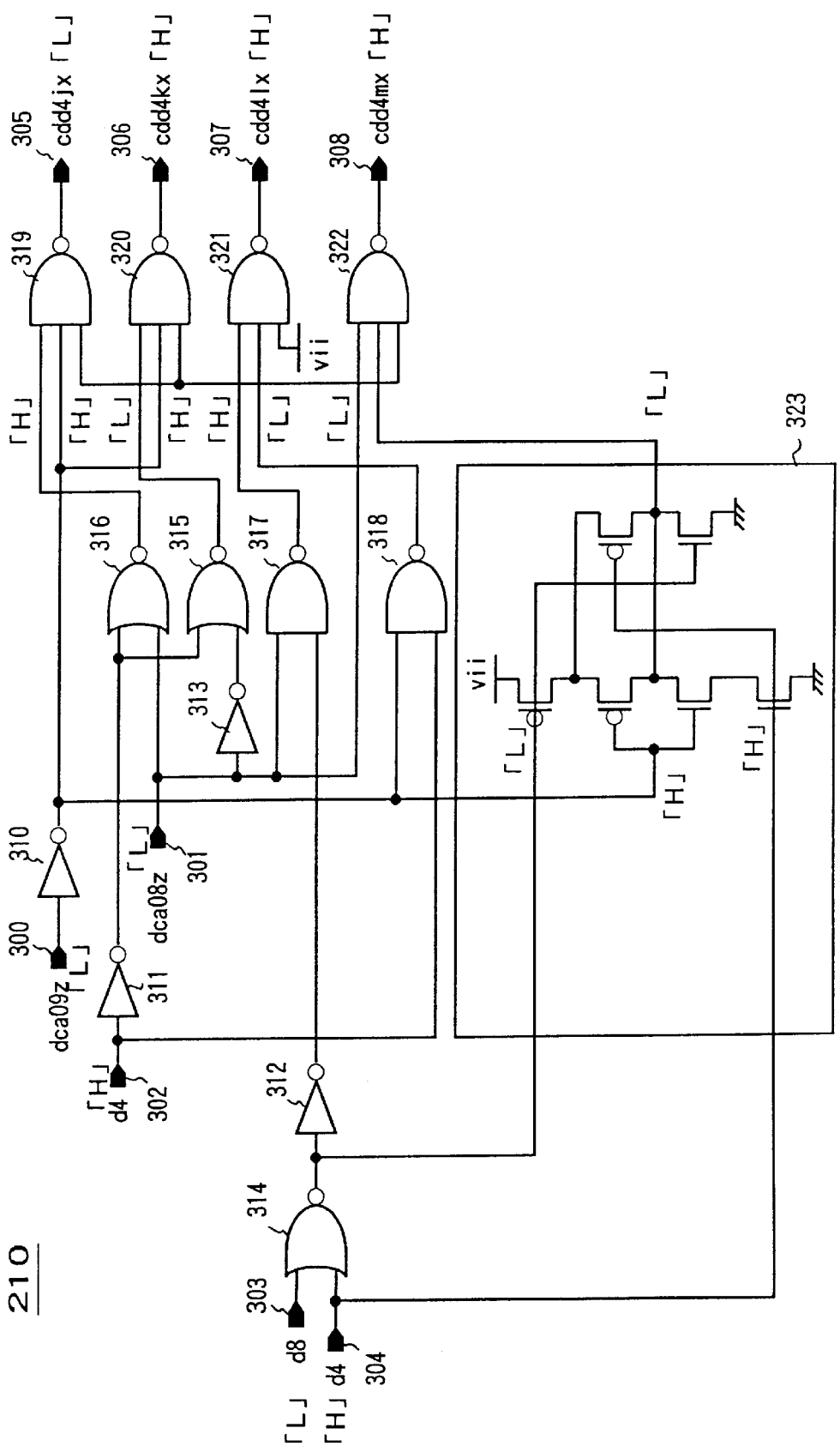
FIG. 13 is a circuit diagram of the 4-bit data bus decoder in which an operation thereof is illustrated with the output data width set equal to 4 bits.

When the output data width is set equal to 4 bits, the decoder 210 operates as shown in FIG. 13. As shown in FIG. 13, the low-level signal is output via the output terminal 305, and the high-level signals are output via the output terminals 306, 307 and 308. Generally, only one of the output terminals 305–308 becomes high in accordance with the combination of the levels of the signals dca08z and dca09z.

Figure 14:
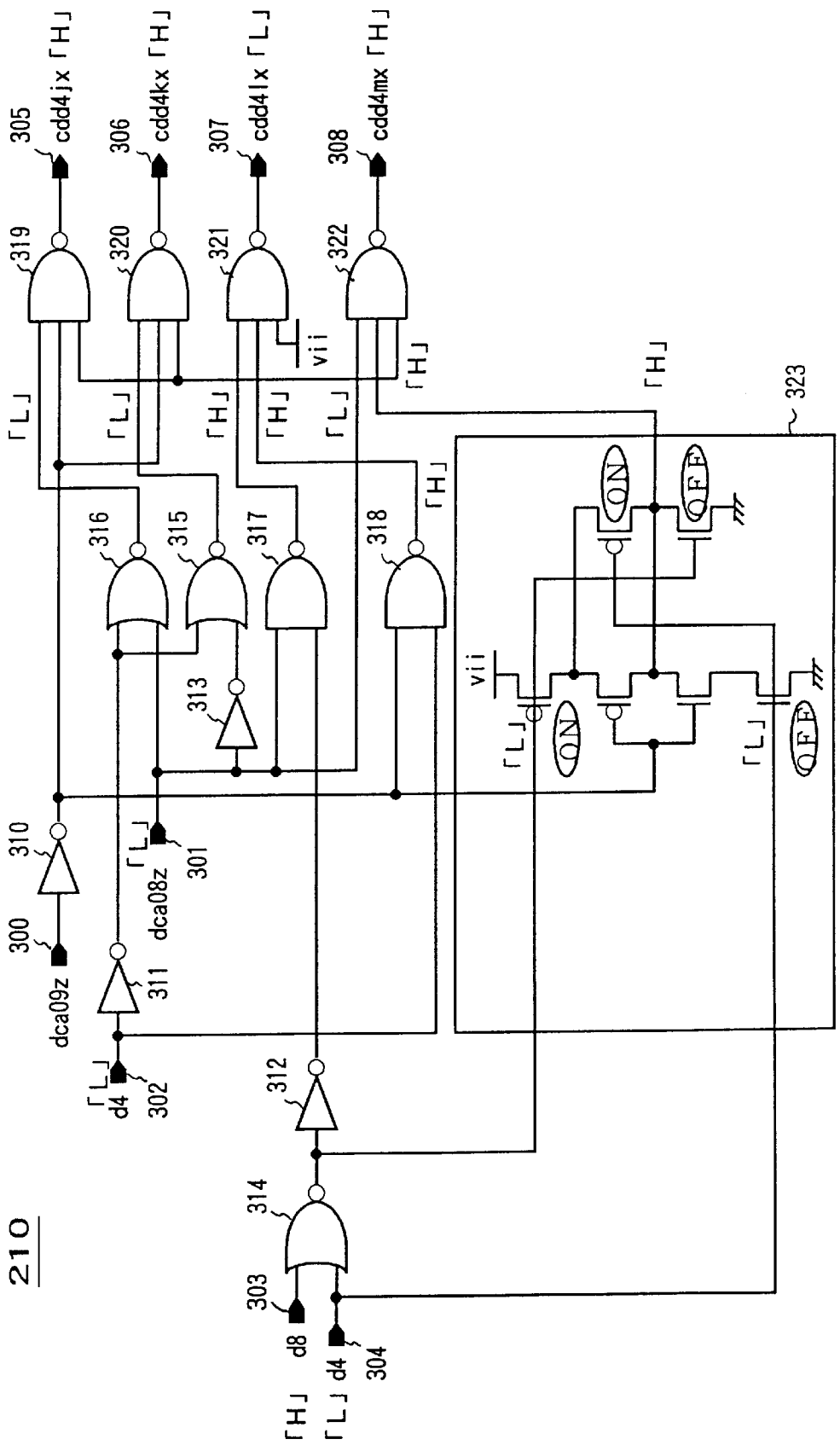
FIG. 14 is a circuit diagram of the 4-bit data bus decoder in which an operation thereof is illustrated with the output data width set equal to 8 bits.

When the output data width is set equal to 8 bits, the decoder 210 operates as shown in FIG. 14. In the case shown in FIG. 14, the signals dca09z and dca08z are both low, while the delay control signals d4 and d8 are respectively low and high. Hence, the low-level signal is output via the output terminal 307, and the high-level signals are output via the output terminals 305, 306 and 308. If the signal dca08z is high, the low-level signal is output via the output terminal 308, and the high-level signals are output via the output terminals 305, 306 and 307. When the output data width is set equal to 8 bits, the high-level signals are always output via the output terminals 305 and 306, and the low-level signal is output via the output terminal 307 or 308 in accordance with the level of the signal dca08z.

Figure 15:
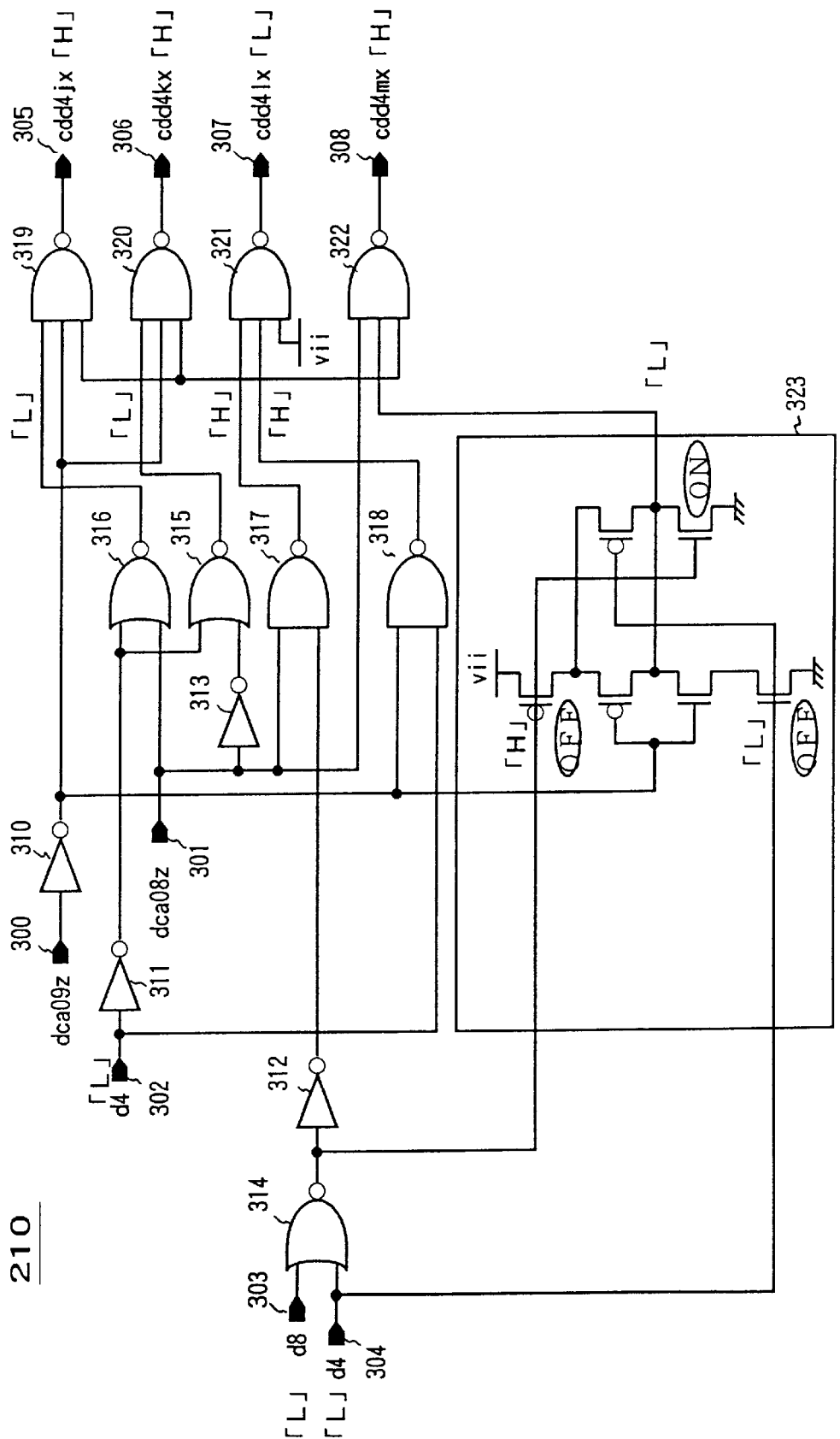
FIG. 15 is a circuit diagram of the 4-bit data bus decoder in which an operation thereof is illustrated with the output data width set equal to 16 bits.

When the output data width is set equal to 16 bits, the decoder 210 operates as shown in FIG. 15. In the case shown in FIG. 15, the delay control signals d4 and d8 are both low, and the decoded column address signals dca08z and dca09z are both low. Hence, the low-level signal is output via the output terminal 307, and the high-level signals are output via the output terminals 305, 306 and 308. When the output data width is set equal to 16 bits, the high-level signals are always output via the output terminals 305, 306 and 308, and the low-level signal is output via the output terminal 307. It is possible to output the low-level signals via all the output terminals 305–308.

The other data bus decoders 214–225 are configured in a manner similar to that of the decoders 210–213.

FIG. 16 shows the relationship between the levels of the signals dca08z and dca09z and the output terminal via which the low-level signal is output.

Figure 17:
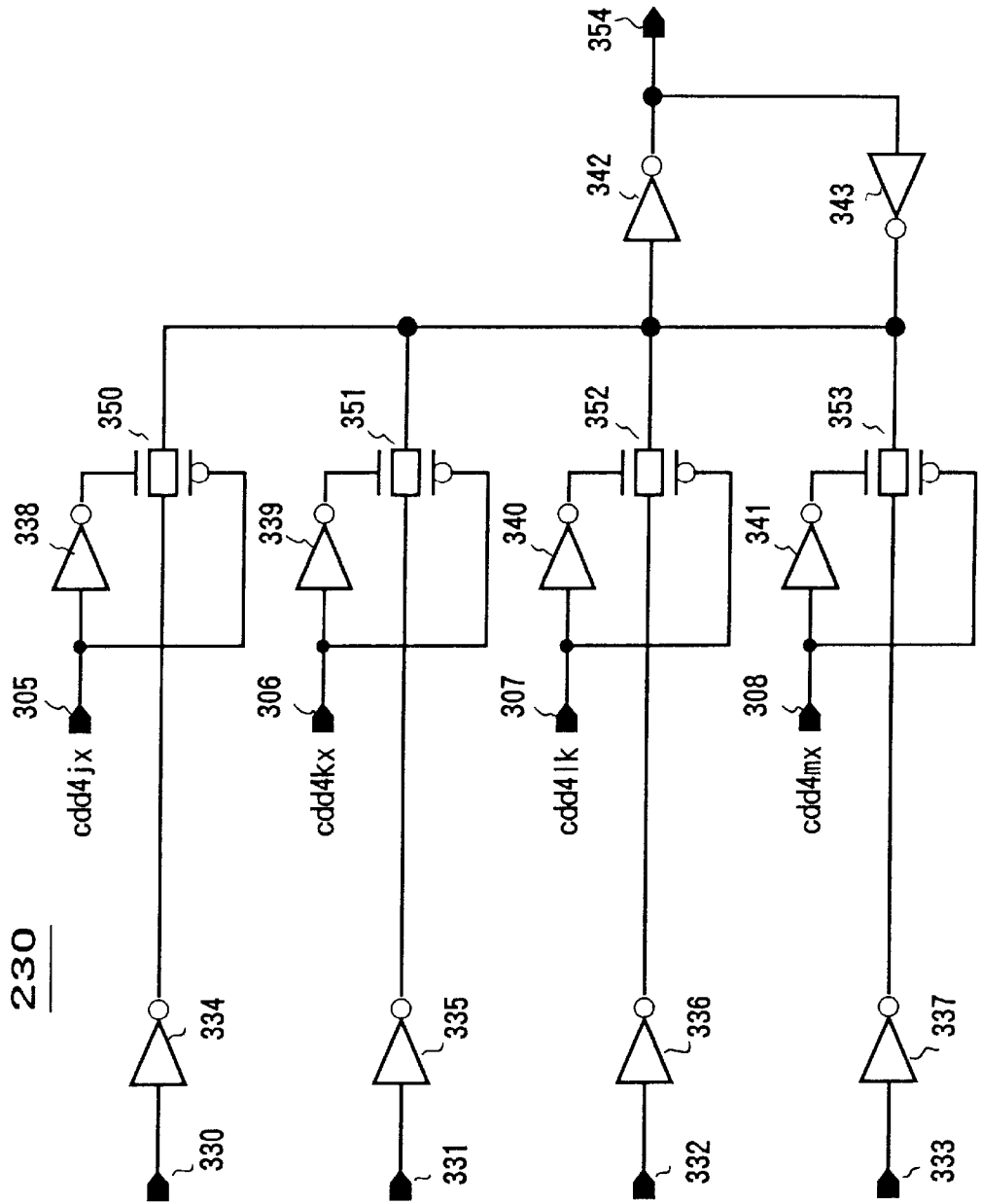
FIG. 17 is a circuit diagram of a 4-bit common data bus switch circuit shown in FIG. 11.

FIG. 17 is a circuit diagram of the common data bus switch 230. As shown in FIG. 17, the common data bus switch 230 is made up of inverters (NOT circuits) 334–343, and transfer gates 350–353. It is to be noted that FIG. 17 shows one of each of the four pairs of data lines for the sake of simplicity. Input terminals 330–333 to which the inverters 334–337 are respectively connected are connected to the data latch circuit 113 shown in FIG. 11. The four bits cdd4jx, cdd4kx, cdd4lx and cdd4mx of the switch control signal are respectively applied to the transfer gates 350, 351, 352 and 353 via the terminals 305, 306, 307 and 308, as shown in FIG. 17. As has been described previously, only one of the signals cdd4jx, cdd4kx, cdd4lx and cdd4mx is low in accordance with the output data width. The output data selected by one of the transfer gates 350–353 is latched by the flip-flop made up of the inverters 342 and 343, and is output via an output terminal 354. The output terminal 354 is connected to, for example, the inverter 41 shown in FIG. 5.

When the blocks should be masked, it is preferable that the output terminals 53-0–53-n should be set to a high-impedance state.

Figure 18:
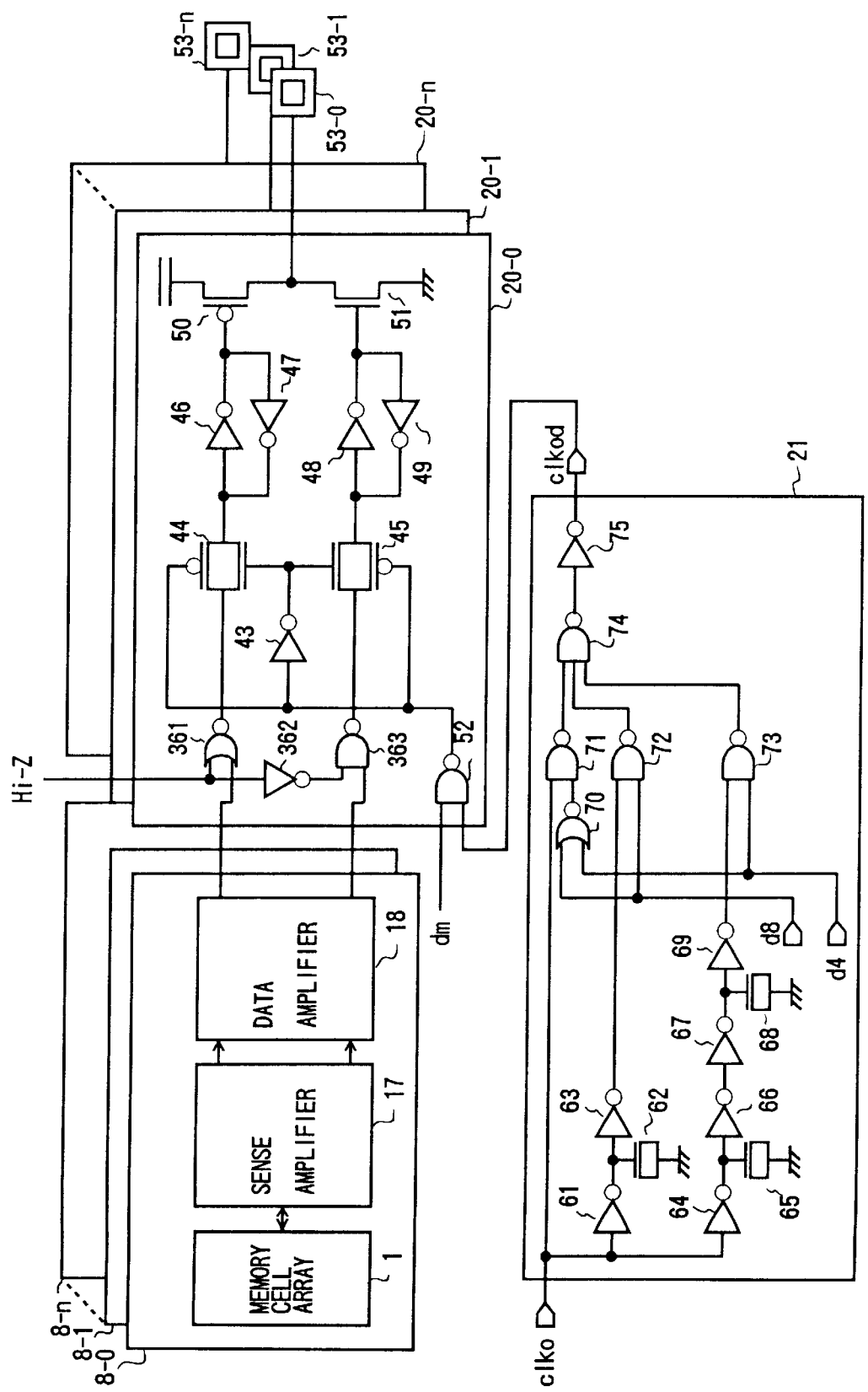
FIG. 18 is a circuit diagram of an SDRAM equipped with a high-impedance control circuit.

FIG. 18 is a diagram showing an SDRAM device equipped with a high-impedance control circuit for setting the output terminal to the high-impedance state. The control circuit is provided in each of the output circuits 20-0–20-n and is made up of a NOR gate 361, an inverter 362 and a NAND gate 363. A high impedance control signal Hi-Z is applied to the NOR gate 361, and is applied to the NAND gate 363 via the inverter 362. When the high-impedance control signal Hi-Z is high, the high-level signal is applied to the gate of the transistor 50, and the low-level signal is applied to the gate of the transistor 51. Hence, the transistors 50 and 51 are both off. Hence, the output terminal 53-0 is set to the high impedance. The high-impedance control signal may be the same signal as the mask control signal dm.

Figure 19:
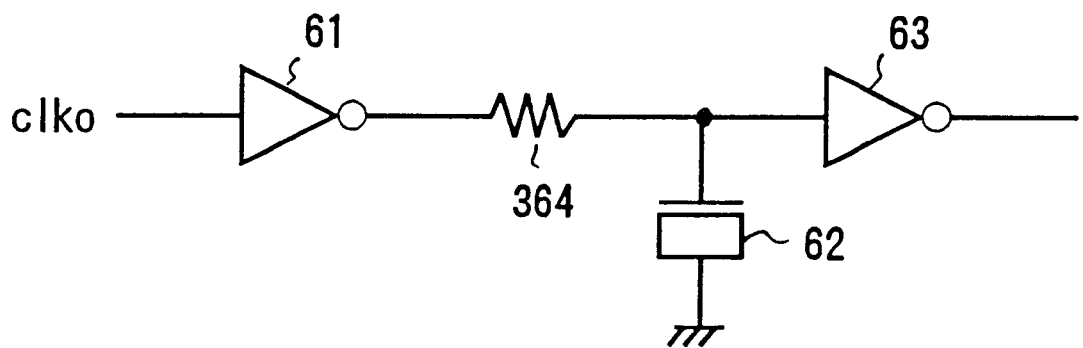
FIG. 19 is a circuit diagram of a delay circuit having a configuration different from that shown in the previous figures.

The delay circuits provided in the delay circuit 21 are not limited to the specifically described configurations. For example, the capacitors 62, 65 and/or 68 shown in FIG. 5 may be omitted. It is also possible to add a resistor 364 between the inverters 61 and 63, as shown in FIG. 19. Such a resistor may be provided between the inverters 64 and 66 and between the inverters 67 and 69.

The present invention is not limited to the specifically disclosed embodiments, and variations and modifications may be made without departing from the scope of the present invention.

The present application is based on Japanese priority application nos. 10-115508 and 10-203495 filed on Apr. 24, 1998 and Jul. 17, 1999, the entire contents of which are hereby incorporated by reference.

What is claimed is:

1. A semiconductor integrated circuit comprising:
    a plurality of circuits operating in parallel in accordance with a timing signal and having an enabled state and a disabled state;
    a control circuit setting each of the plurality of circuits to the enable state or the disabled state in accordance with an operation mode; and
    a timing adjustment circuit adjusting the timing signal in accordance with a number of circuits which are in the enabled state.

2. The semiconductor integrated circuit as claimed in claim 1, wherein the control circuit determines the operation mode in accordance with a mode instruction signal.

3. The semiconductor integrated circuit as claimed in claim 1, further comprising an operation mode memory circuit which stores the operation mode, wherein the control circuit reads the operation mode from the operation mode memory circuit.

4. The semiconductor integrated circuit as claimed in claim 1, wherein the plurality of circuits are data output circuits.

5. The semiconductor integrated circuit as claimed in claim 1, wherein:
    the semiconductor device inputs and outputs data having a variable data width;
    the control circuit determines circuits among the plurality of circuits which should be set to the enabled state; and
    the timing adjustment circuit delays the timing signal by a delay amount in accordance with the number of circuits to be set to the enabled state.

6. The semiconductor integrated circuit as claimed in claim 1, wherein the timing adjustment circuit adjusts the timing signal so that data can be output from the plurality of circuits at a constant timing irrespective of the number of circuits which are in the enabled state.

7. The semiconductor integrated circuit as claimed in claim 1, wherein:
    the timing adjustment circuit comprises a plurality of delay circuits having different delay amounts;
    the timing signal is delayed through one of the plurality of delay circuits which is based on the number of circuits which are in the enabled state.

8. The semiconductor integrated circuit as claimed in claim 1, wherein each of the plurality of circuits comprise a high-impedance control circuit which sets an output terminal for outputting data to a high-impedance state in the disabled state.

9. A semiconductor memory comprising:
    a plurality of blocks including memory cell arrays;
    an I/O part having output circuits which respectively correspond to the plurality of blocks, the output circuits, outputting data from the plurality of blocks in parallel in accordance with a timing signal and;
    a control circuit setting each of the output circuits to an enable state or a disabled state in accordance with an operation mode; and
    a timing adjustment circuit adjusting the timing signal in accordance with a number of output circuits which are in the enabled state.

10. The semiconductor memory as claim in claim 9, wherein the timing adjustment circuit controls the timing signal so that data is output from the output circuits at a constant timing irrespective of the number of output circuits which are in the enable state.

11. The semiconductor memory as claimed in claim 9, wherein the semiconductor memory device is a synchronous dynamic random access memory device.

12. The semiconductor memory as claimed in claim 9, wherein the number of the output circuits which are in-the enabled state corresponds to a data width of data which is output from the semiconductor memory.

13. The semiconductor memory as claimed in claim 1, wherein:
   the timing control part comprises a delay unit, which delays the control signal in accordance with the selected bit arrangement.

* * * * *